(12) United States Patent
Maruyama

(10) Patent No.: US 7,298,457 B2
(45) Date of Patent: Nov. 20, 2007

(54) ALIGNMENT APPARATUS, EXPOSURE APPARATUS, AND DEVICE MANUFACTURING METHOD USING EXPOSURE APPARATUS

(75) Inventor: Hiroyuki Maruyama, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 86 days.

(21) Appl. No.: 11/347,037

(22) Filed: Feb. 3, 2006

(65) Prior Publication Data

US 2006/0176465 A1  Aug. 10, 2006

(30) Foreign Application Priority Data

Feb. 4, 2005  (JP) ............................. 2005-029832

(51) Int. Cl.
*G03B 27/58* (2006.01)

(52) U.S. Cl. .................. 355/72; 356/498; 356/500
(58) Field of Classification Search .................. 355/72, 355/75; 356/498–500, 508–510
See application file for complete search history.

(56) References Cited

U.S. PATENT DOCUMENTS

| 5,959,732 | A | 9/1999 | Hara | 356/358 |
| 6,407,799 | B2 | 6/2002 | Hara | 355/53 |
| 2002/0008971 | A1 | 1/2002 | McKenna | 362/223 |
| 2002/0015139 | A1* | 2/2002 | Hara | 355/53 |

FOREIGN PATENT DOCUMENTS

JP  2002-008971  1/2002

* cited by examiner

*Primary Examiner*—D. Rutledge
(74) *Attorney, Agent, or Firm*—Cowan, Liebowitz & Latman, P.C.

(57) ABSTRACT

An alignment apparatus includes driving means having a movable element and a stator, a measurement unit which measures a position of a moving member moved by the driving means using measurement light, and a discharging unit to discharge gas existing in an optical path of the measurement light. The discharging unit is provided to the stator.

18 Claims, 6 Drawing Sheets

ALIGNMENT APPARATUS, EXPOSURE APPARATUS, AND DEVICE MANUFACTURING METHOD USING EXPOSURE APPARATUS

FIELD OF THE INVENTION

The present invention relates to an alignment apparatus having driving means comprising a movable element and stator, and a laser interferometer to measure the position of a moving member moved by the driving means, an exposure apparatus, and the like.

BACKGROUND OF THE INVENTION

In general, the position of a wafer stage or reticle stage provided to an exposure apparatus is measured by a laser interferometer. It is known that the measurement accuracy of the laser interferometer is decreased by the temperature fluctuation (variation) of the optical path of measurement light. In order to suppress the temperature fluctuation, a technique is available which controls the temperature of a refrigerant by circulating the refrigerant in the surface of a heat-generating member arranged in the vicinity of a space where the measurement light is guided, thereby decreasing the temperature fluctuation of the optical path.

A technique is also available which supplies temperature-controlled gas to a space where measurement light is guided (for example, Japanese Patent Laid-Open No. 2002-008971), thereby decreasing the temperature fluctuation of the optical path.

When the refrigerant is circulated in the surface of the heat-generating member as described above, as the quantity of generated heat increases, the flow rate of the refrigerant to be circulated must also be increased. If the flow rate of the refrigerant increases, however, the pressure acting on a pipe or cooling jacket to supply the refrigerant increases. For this reason, the pipe wall must be increased so the pressure will not break the pipe or cooling jacket (to be referred to as a pipe or the like hereinafter). Particularly, when the heat-generating member is a linear motor coil, if the pipe wall increases, the distance between the coil and a magnet increases to decrease the thrust. If the flow rate of the refrigerant increases, the flow of the refrigerant may induce the vibration of the pipe or the like. This is because when the flow rate of the refrigerant increases, the flow of the refrigerant becomes turbulence. Such vibration serves as a disturbance to the control system of an alignment apparatus such as a linear motor.

As described above, when temperature-controlled gas is supplied to a space where measurement light is guided, if the flow rate of the gas increases, the filter may produce dust. When the temperature-controlled gas is to be supplied in an exposure apparatus, it is generally done so through a filter. The filter generally has a regulated velocity. If the flow rate exceeds the regulated velocity, the filter produces dust. Even when no filter is used, if the flow rate of the gas is increased, it induces vibration of the pipe or the like employed to circulate the gas. When the velocity of the gas is further increased, a negative pressure is generated where the gas flows, to involve surrounding gas, generating temperature fluctuation.

SUMMARY OF THE INVENTION

The present invention has been made in view of the above problems, and has as its object to provide a technique which suppresses the temperature fluctuation or the like of a measurement optical path to improve position measurement accuracy, thereby performing highly accurate exposure.

In order to solve the above problems and to achieve the above object, according to one aspect of the present invention, there is provided an alignment apparatus comprising driving means having a movable element and a stator, a measurement unit which measures a position of a moving member moved by the driving means using measurement light, and a discharging unit to discharge gas existing in an optical path of the measurement light, the discharging unit being provided to the stator.

An exposure apparatus which aligns a master and a substrate relative to each other by using the alignment apparatus described above and exposes the master, and a device manufacturing method of manufacturing a device by using the exposure apparatus are also incorporated in a scope to which the present invention can be applied.

According to the present invention, temperature fluctuation or the like of the optical path of measurement light can be suppressed to improve the position measurement accuracy.

Other objects and advantages besides those discussed above shall be apparent to those skilled in the art from the description of a preferred embodiment of the invention which follows. In the description, reference is made to accompanying drawings, which form a part thereof, and which illustrate an example of the invention. Such example, however, is not exhaustive of the various embodiments of the invention, and therefore reference is made to the claims which follow the description for determining the scope of the invention.

DETAILED DESCRIPTION OF THE PREFERRED EMBODIMENTS

The embodiments of the present invention will be described hereinafter in detail with reference to the accompanying drawings.

Note that the embodiments to be described hereinafter are merely examples of a means that implements the present invention, and should be appropriately modified or changed depending on the arrangement and various types of conditions of an apparatus to which the present invention is applied.

In addition to the device manufacture to be described hereinafter, the present invention can also be applied to various types of precision machining apparatuses, various types of precision measurement apparatuses, and a method of manufacturing a semiconductor device or the like by using such a device manufacturing apparatus.

First Embodiment

Figure 1:
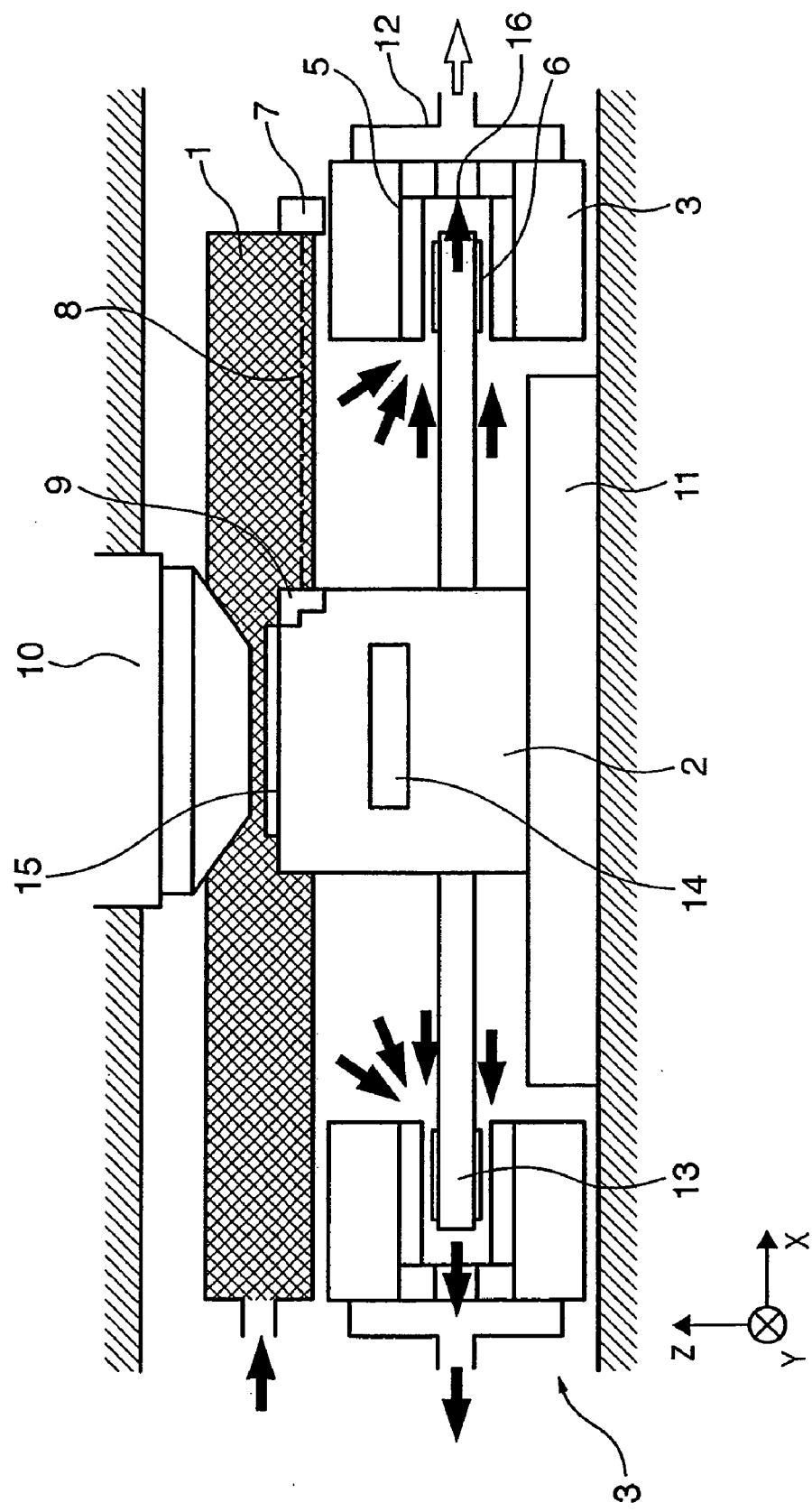
FIG. 1 is a front view showing the schematic arrangement and gas flows of an embodiment of the present invention.
Figure 2:
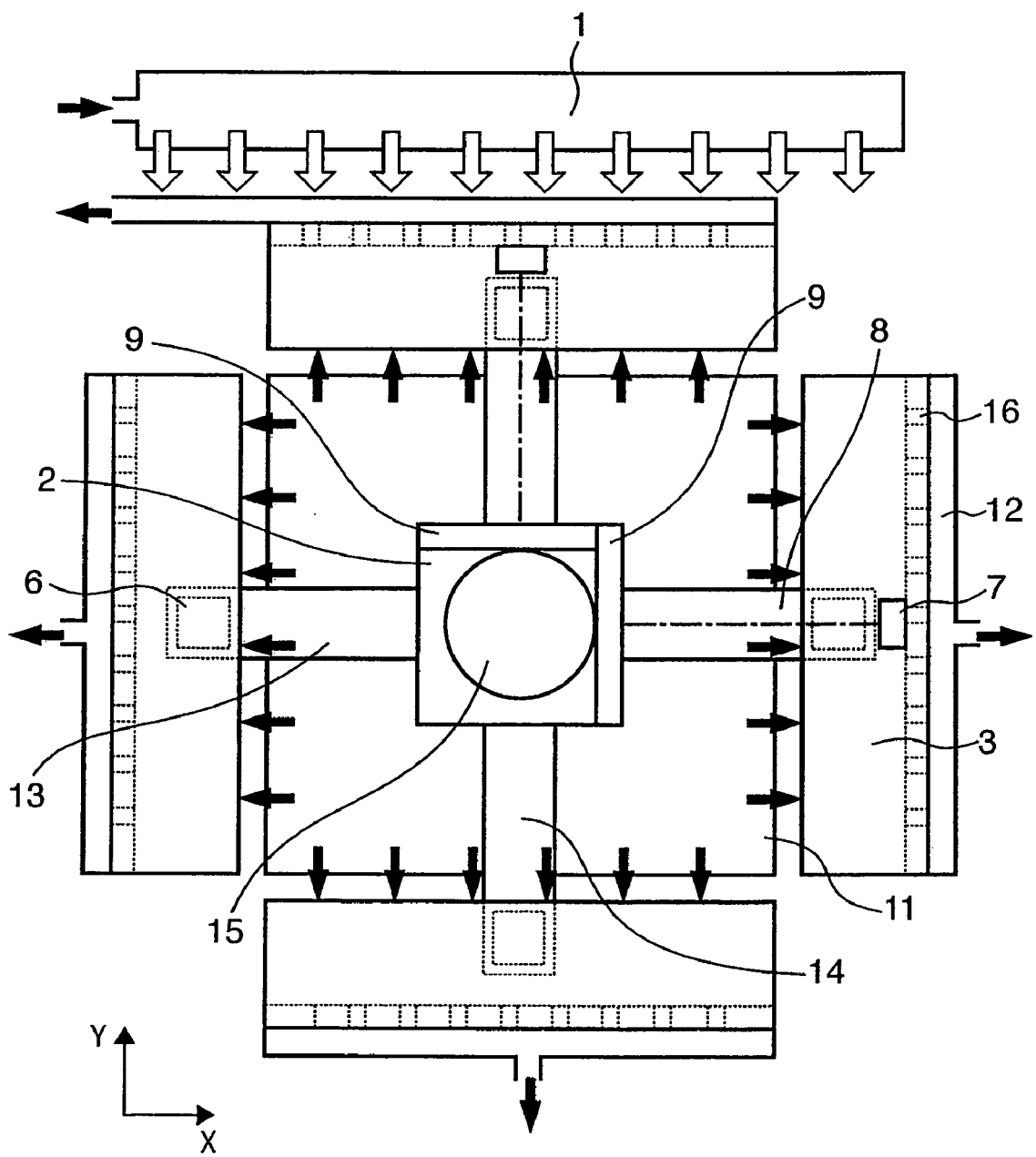
FIG. 2 is a plan view showing the schematic arrangement and gas flows of the embodiment of the present invention shown in FIG. 1.

FIG. 1 is a view showing the schematic arrangement of an exposure stage (wafer stage) in an exposure apparatus (device manufacturing apparatus) according to a preferred embodiment of the present invention, and FIG. 2 is a plan view of FIG. 1. Arrows in FIGS. 1 and 2 indicate gas flows.

A pattern formed on a master or original (not shown) is reduced and projected onto a wafer 15 through a projection optical system 10. As the projection optical system 10, a dioptric optical system comprising only a plurality of optical lens elements, an optical system (catadioptric optical system) having a plurality of optical lens elements and at least one concave mirror, an optical system having a plurality of optical lens elements and at least one diffraction optical element such as a kinoform, an all-mirror-type reflection optical system, or the like can be employed.

The wafer stage has a movable element 2 on which the wafer 15 is loaded, a Y guide bar 14 which guides the movable element 2 in a Y direction, an X guide bar 13 which guides the movable element 2 in an X direction, a stage base 11 which guides the movable element 2 to be movable in the X and Y directions and supports it, and linear motors which drive the X and Y guide bars 13 and 14. The linear motors drive the X guide bar 13 in the Y direction and the Y guide bar 14 in the X direction. The movable element 2 moves in the Y direction together with the X guide bar 13 and in the X direction together with the Y guide bar 14.

The linear motors have magnet units 6 (movable elements) provided at the two ends of each of the X and Y guide guides 13 and 14, and coil units (not shown) in stators 3 which are arranged to oppose the corresponding magnet units 6. When a coil which forms each coil unit is energized, a thrust is generated. Each coil unit preferably has a jacket 5 which covers the coil (heat-generating member). The coil that generates heat is cooled by supplying a refrigerant in the corresponding jacket 5.

The movable element 2 has mirrors 9 having reflection surfaces substantially perpendicular to the X- and Y-axes, respectively. Measurement light radiated by a laser interferometer 7 is reflected by the mirrors 9 and returns to the laser interferometer 7. The moving amount of the movable element 2 is measured by the measurement light, so that the position in the X-Y plane of the movable element 2 can be calculated.

Gas from an air-conditioning blowing port 1 is fed to interferometer optical paths 8 where the measurement light is guided. The gas fed from the air-conditioning blowing port 1 can be supplied at a predetermined temperature and predetermined flow rate adjusted by a heat exchange unit and an adjusting means such as a flow control valve provided to a pipe through which the gas (not shown) flows. A temperature sensor (not shown) is arranged in the vicinity of the interferometer optical paths 8 so as to measure the temperature of the gas. The portion to arrange the temperature sensor can be changed when necessary. When the predetermined temperature and predetermined flow rate described above are controlled by a controller (not shown) on the basis of an output from the temperature sensor, the temperature fluctuation can be decreased.

The air-conditioning blowing port 1 through which the interferometer optical paths 8 are to be air-conditioned may be provided to each of X and Y interferometer optical paths. A plurality of air-conditioning blowing ports 1 may be formed in each interferometer optical path.

Each stator 3 is arranged in the form of a U shape to sandwich the corresponding magnet unit 6 from two sides. When a plurality of coils are arranged on the two sides of the magnet, a large thrust can be generated. Each stator 3 has a discharging flow passage 16. The gas in the stator 3 is discharged outside the stator 3 through the discharging flow passage 16. The gas discharged outside the stator 3 is discharged by a pump or the like (not shown) through a discharging cover 12 attached outside the stator 3 and a discharging duct (not shown) connected to the discharging cover 12. Namely, the discharging flow passage 16 is disposed in the stator 3. The discharging cover 12 is disposed outside the discharging flow passage 16 to cover the stator 3 externally.

When a plurality of discharging flow passages 16 are formed and their positions, number, and flow passage sectional areas are set arbitrarily, the discharging flow rate of the stator 3 can be set to a predetermined value. The discharging flow rate of the stator 3 can also be differed in accordance with the discharging position. A plurality of discharging ducts (not shown) may be connected to the discharging cover 12.

Heat of the coils that cannot be removed completely by the refrigerant in the jackets 5 is conducted to the X and Y guide bars 13 and 14 through the magnet units 6 to change the temperatures of the X and Y guide bars 13 and 14 to be different from those of the interferometer optical paths 8. The temperatures of the gases in the stators 3 and around the X and Y guide bars 13 and 14 also become different from those of the interferometer optical paths 8. When the movable element 2 moves, the X and Y guide bars 13 and 14 also move accordingly. Thus, the gases in the stators 3 and around the X and Y guide bars 13 and 14 are undesirably pushed out toward the interferometer optical paths 8.

In view of this, according to this embodiment, the gas discharging flow passages 16 (discharging means) are provided to the stators 3. This suppresses the temperature fluctuation of the gas which occurs when the gases in the interferometer optical paths 8 are mixed with gas having a temperature different from those of the interferometer optical paths 8 by the X and Y guide bars 13 and 14. Furthermore, when the discharging flow passages 16 are arranged in the stators 3, the quantities of the gases to be pushed out to the interferometer optical paths 8 can be suppressed. Consequently, the temperature fluctuation of the gases in the interferometer optical paths 8 can be suppressed, so that the position of the movable element 2 can be measured by the laser interferometer 7 at high accuracy.

Contamination (contaminant) produced by the members (the jackets 5, magnet units 6, X guide bar 13, Y guide bar 14, and the like) used in the exposure space and by adhesives used by the respective members fogs the glass material of the lower surface of a lens that forms the projection optical system 10, and causes reaction with a chemically multiplied resist applied to the wafer 15, to decrease the exposure performance. When discharging means are provided inside the stators as in this embodiment, the contamination will not reach the wafer or the lower surface of the lens but can be discharged.

Second Embodiment

Figure 3:
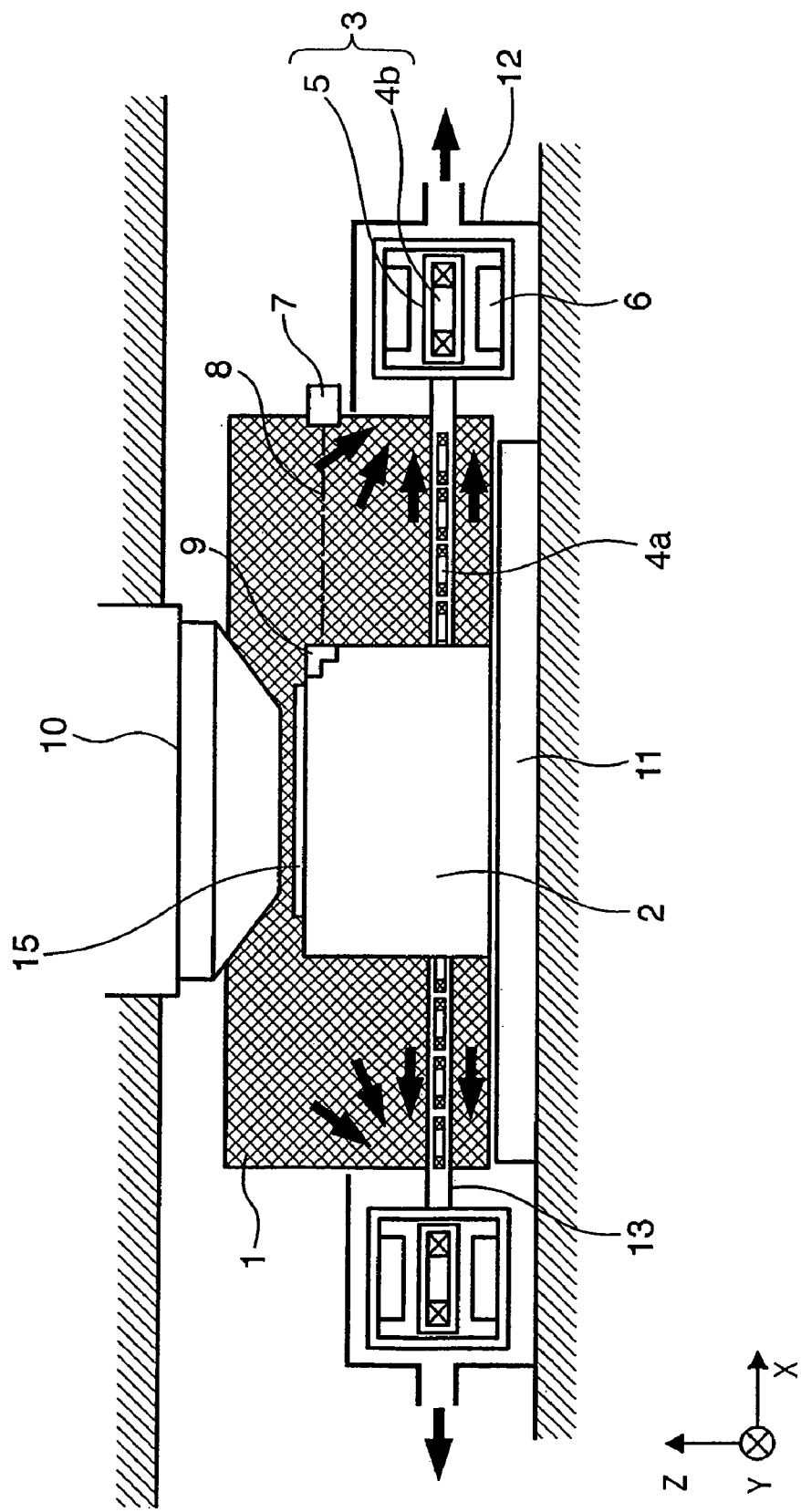
FIG. 3 is a front view showing the schematic arrangement and gas flows of another embodiment of the present invention.
Figure 4:
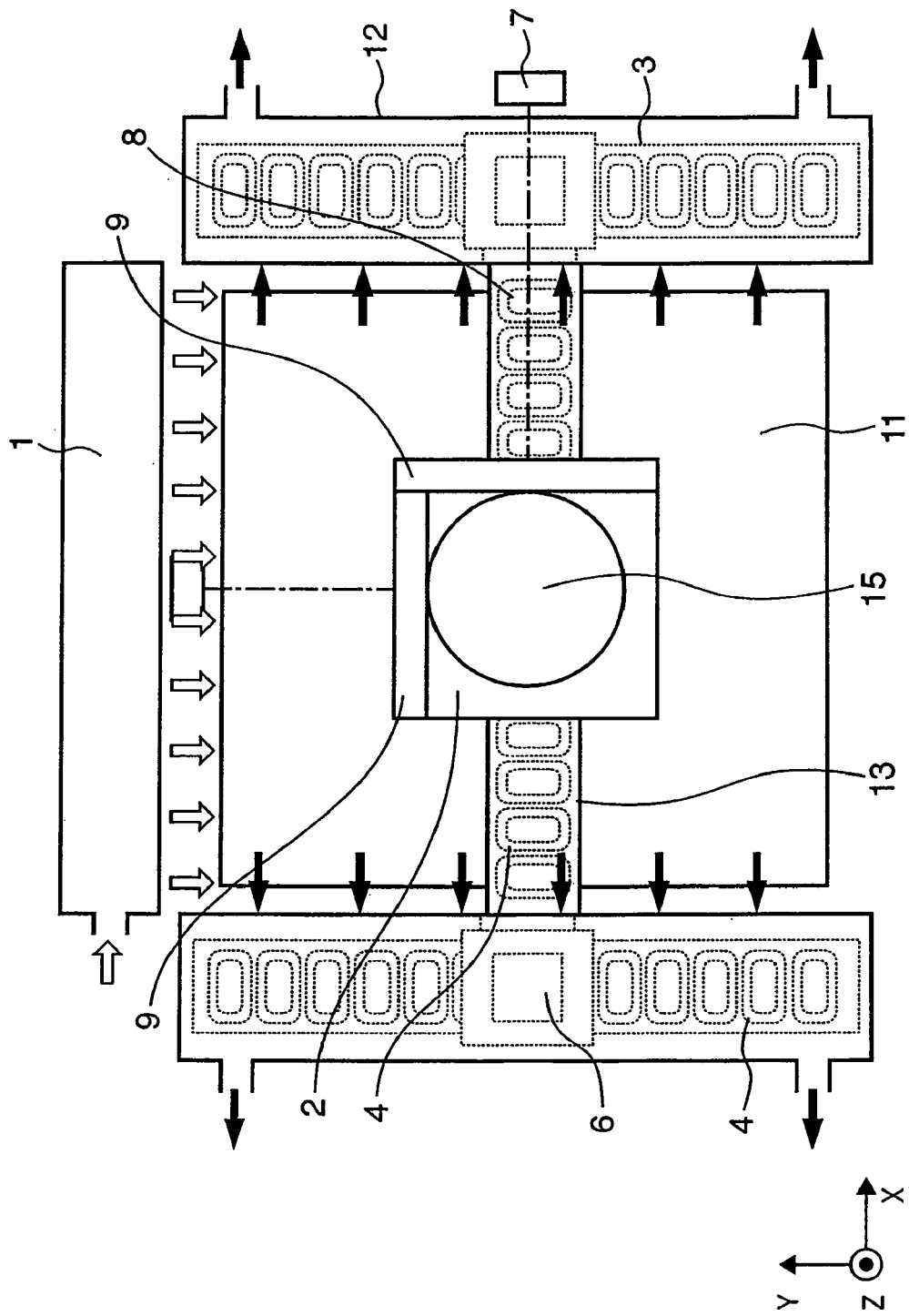
FIG. 4 is a plan view showing the schematic arrangement and gas flows of the embodiment of the present invention shown in FIG. 3.

FIG. 3 is a view showing the schematic arrangement of a wafer stage according to the second embodiment of the present invention, and FIG. 4 is a plan view of FIG. 3. The arrows in FIGS. 3 and 4 indicate the flows of gas. Constituent components having the same functions as those of the first embodiment are denoted by the same reference numerals, and a detailed description thereof will be omitted.

The second embodiment provides an arrangement which does not have a Y guide bar used in the first embodiment. An X guide bar 13 serves as a linear motor. A permanent magnet (not shown) serving as a linear motor movable element is provided to a movable element 2 on which a wafer 15 is loaded. Coils 4a serving as linear motor stators are arranged in the X guide bar 13 in an X direction so as to oppose the permanent magnet. When the coils are energized, the movable element 2 can move in the X direction. Coils may be arranged in the movable element 2 and a permanent magnet may be arranged in the X guide bar 13.

Magnet units 6 are arranged at the two ends of the X guide bar 13. The X guide bar 13 can be moved in a Y direction in the same manner as in the first embodiment.

The movable element 2 is supported on a stage base 11 through a gas bearing such as a hydrostatic bearing to be movable in the X and Y directions.

According to the second embodiment, discharging covers 12 are arranged to cover respective stators 3. Gas around the stators 3 is discharged by a pump or the like (not shown) through discharging ducts (not shown) connected to the discharging covers 12.

When a plurality of discharging ducts (not shown) are connected to the discharging covers 12 and their positions, number, and flow passage sectional areas are set arbitrarily, the discharging flow rate can be set to a predetermined value.

An air-conditioning blowing port (gas supply means) for feeding gas may be applied to air conditioning of a member other than an interferometer optical path 8, and may be arranged at a portion other than in a stage space depending on the position of the blowing target. This embodiment is not limited to prevention of the temperature fluctuation of the interferometer optical path 8, but can be applied to an apparatus to which air-conditioned gas is not supplied, an apparatus such as an EUV exposure apparatus which is used in a vacuum atmosphere, an apparatus which performs gas supply (for example, local gas supply for a lens or the like) which is not aimed at temperature conditioning of the interferometer optical path, and the like.

[Device Manufacturing Method]

Figure 5:
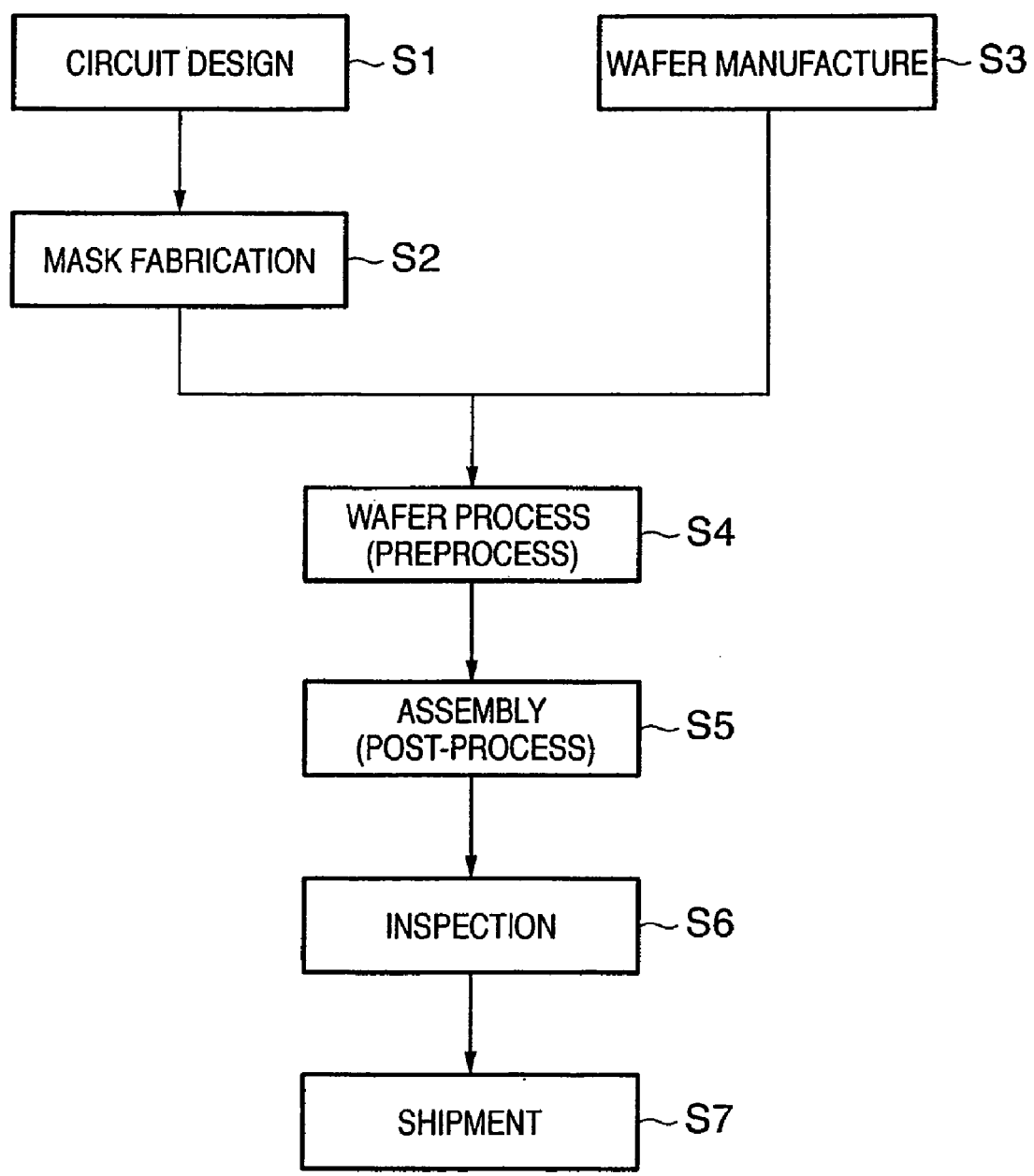
FIG. 5 is a flowchart showing a device manufacturing method.

A semiconductor device manufacturing process which uses this exposure apparatus will be described. FIG. 5 is a flowchart showing the flow of the entire semiconductor device manufacturing process. In step S1 (circuit design), the circuit of a semiconductor device is designed. In step S2 (mask fabrication), a mask is fabricated on the basis of the designed circuit pattern.

In step S3 (wafer manufacture), a wafer is manufactured using a material such as silicon. In step S4 (wafer process) called a preprocess, an actual circuit is formed on the wafer by the above exposure apparatus in accordance with lithography using the above mask and wafer. In the next step S5 (assembly) called a post-process, a semiconductor chip is formed using the wafer fabricated in step S4. This step includes assembly processes such as assembly (dicing and bonding) and packaging (chip encapsulation). In step S6 (inspection), inspections such as an operation check test and durability test of the semiconductor device fabricated in step S5 are performed. A semiconductor device is finished with these steps and shipped in step S7.

Figure 6:
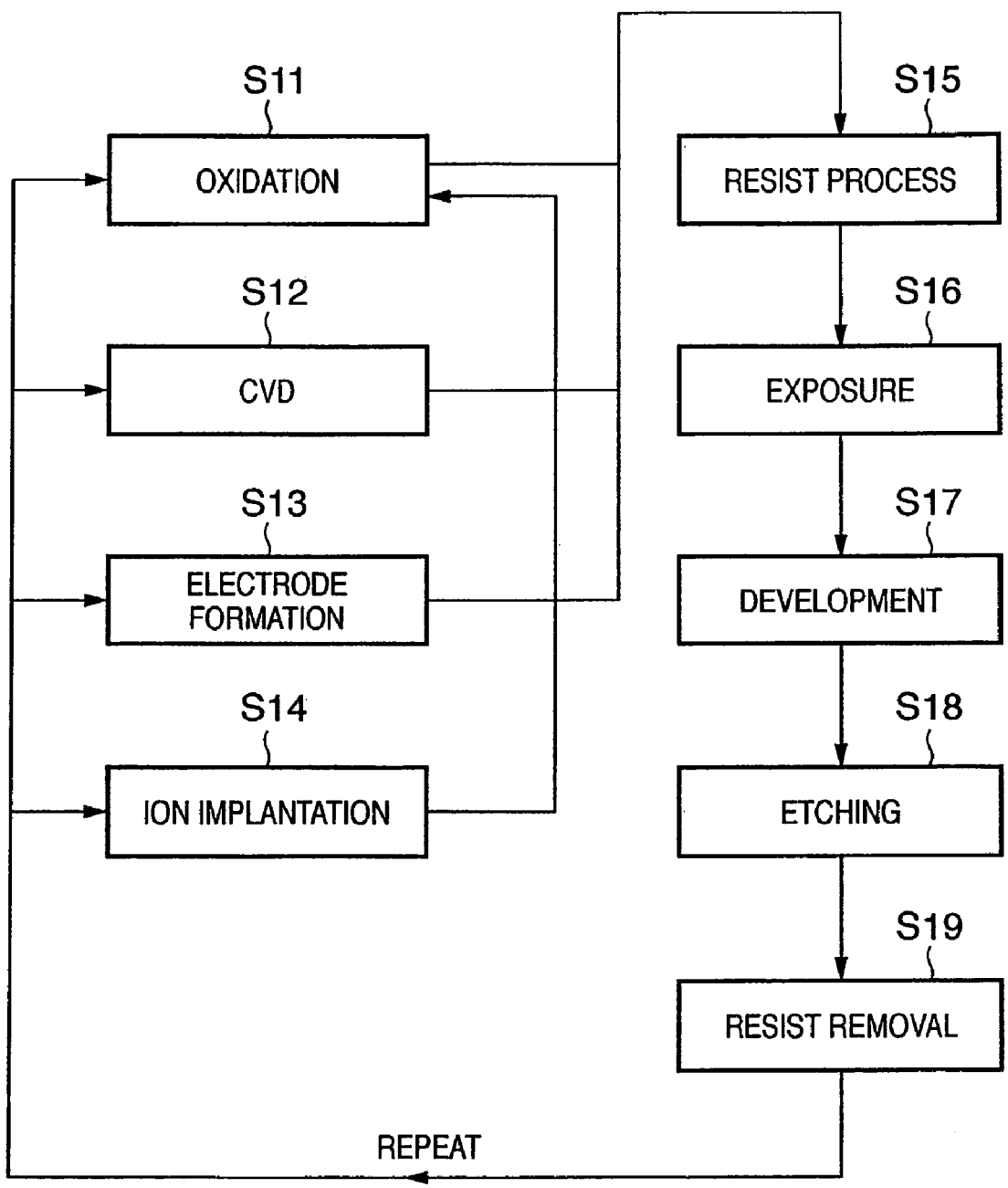
FIG. 6 is a flowchart showing a wafer process.

The wafer process of step S4 has the following steps (FIG. 6), i.e., an oxidation step (S11) of oxidizing the surface of the wafer, a CVD step (S12) of forming an insulating film on the wafer surface, an electrode formation step (S13) of forming an electrode on the wafer by deposition, an ion implantation step (S14) of implanting ions in the wafer, a resist process step (S15) of applying a photosensitive agent to the wafer, an exposure step (S16) of transferring the circuit pattern to the wafer after the resist process by the exposure apparatus described above, a developing step (S17) of developing the wafer exposed in the exposure step, an etching step (S18) of removing portions other than the resist image developed in the developing step, and a resist removal step (S19) of removing any unnecessary resist after etching. These steps are repeated to form multiple circuit patterns on the wafer.

[Effect]

The function and effect of the preferred embodiments of the present invention will be described.

According to the above embodiments, in the device manufacturing apparatus having a wafer space and reticle space, gas and a liquid refrigerant are used as a temperature-conditioning means to condition the temperatures of a stator such as coils or magnets of a stage, a movable element, the wafer space, and the reticle space. A discharging port is formed in a boundary wall that forms the wafer space and reticle space to discharge the gas.

The position of the discharging port can be determined by considering the flow of gas and heat radiation from the heat-generating body such as the driving means which uses the liquid refrigerant, such that the gas temperature distribution and gas temperature fluctuation in the optical path of a laser interferometer which aligns the movable element such as the stage become minimal.

Thus, cooling with the gas and liquid refrigerant and accurate air conditioning of the movable element aligning laser interferometer optical path can be performed efficiently while satisfying required apparatus performance.

Regarding a cooling target having a particularly large heat generation quantity and/or a cooling target that should not radiate heat to the surrounding atmosphere, for example, assume a case of the device manufacturing apparatus, particularly the exposure apparatus, having the driving means such as a linear motor and a solenoid actuator. Preferably, a liquid refrigerant may be used to cool the driving means, and a discharging port may be formed in the driving means on the stator side to discharge gas, so a gas flow from the movable element side of the driving means toward the stator is generated.

In this case, since the thermal influence of the driving means on the laser interferometer optical path decreases, degradation of performance (e.g., alignment accuracy or focusing accuracy) of the exposure apparatus which is caused by heat generation is suppressed, so that a fine pattern can be transferred onto the substrate highly accurately. A decrease in thermal influence on the laser interferometer optical path contributes to an improvement of a stage velocity or the like and furthermore an improvement of the processing speed (throughput).

The present invention is not limited to the above embodiment, and various changes and modifications can be made thereto within the spirit and scope of the present invention. Therefore, to apprise the public of the scope of the present invention, the following claims are made.

This application claims the benefit of Japanese Patent Application No. 2005-029832, filed Feb. 4, 2005, which is hereby incorporated by reference herein in its entirety.

What is claimed is:

1. An alignment apparatus comprising:
    a driving unit configured to have movable elements and stators;
    a measurement unit which measures a position of a moving member moved by said driving unit using measurement light; and
    a discharging unit configured to discharge gas existing in an optical path of the measurement light,
    wherein said discharging unit is provided to said stators and has a discharging flow passage in each of said stators.

2. The apparatus according to claim 1, further comprising a gas supply unit which supplies the gas.

3. The apparatus according to claim 2, wherein said gas supply unit supplies gas controlled to a predetermined temperature to an optical path of said measurement unit.

4. The apparatus according to claim 1, wherein said discharging unit has a different discharging amount depending on a discharging position of the gas.

5. The apparatus according to claim 1, wherein said measurement unit measures the position of said moving member using a laser beam.

6. The apparatus according to claim 1, wherein said driving means comprises a linear motor which uses a permanent magnet as said movable element and a coil as said stator.

7. An alignment apparatus comprising:
    a driving configured to have movable elements and stators;
    a measurement unit which measures a position of a moving member moved by said driving unit using measurement light; and
    a discharging unit configured to discharge gas existing in an optical path of the measurement light,
    wherein said discharging unit is arranged to cover said driving unit externally.

8. The apparatus according to claim 7, wherein said discharging unit has a discharging flow passage in said stator.

9. The apparatus according to claim 8, wherein said discharging flow passage comprises discharging flow passages corresponding in number to the number of stators.

10. The apparatus according to claim 7, further comprising a gas supply unit which supplies the gas.

11. The apparatus according to claim 10, wherein said gas supply unit supplies gas controlled to a predetermined temperature to an optical path of said measurement unit.

12. The apparatus according to claim 7, wherein said discharging unit has a different discharging amount depending on a discharging position of the gas.

13. The apparatus according to claim 7, wherein said measurement unit measures the position of said moving member using a laser beam.

14. The apparatus according to claim 7, wherein said driving means comprises a linear motor which uses a permanent magnet as said movable element and a coil as said stator.

15. An exposure apparatus which exposes a pattern of a master to a substrate, comprising an alignment apparatus including:
    a driving unit configured to have a movable elements and stators, a measurement unit which measures a position of a moving member moved by said driving unit using measurement light, and a discharging unit configured to discharge gas existing in an optical path of the measurement light, said discharging unit being provided to said stators and having a discharging flow passage in each of said stators,
    wherein exposure is performed after aligning the master and the substrate relative to each other by said moving member.

16. A device manufacturing method comprising steps of:
    exposing a substrate using an exposure apparatus according to claim 15; and
    developing the substrate.

17. An exposure apparatus which exposes a pattern of a master to a substrate, comprising an alignment apparatus including:
    a driving unit configured to have movable elements and stators, a measurement unit which measures a position of a moving member moved by said driving unit using measurement light, and a discharging unit configured to discharge gas existing in an optical path of the measurement light, said discharging unit being arranged to cover said driving unit externally,
    wherein exposure is performed after aligning the master and the substrate relative to each other by said moving member.

18. A device manufacturing method comprising steps of:
    exposing a substrate using an exposure apparatus according to claim 17; and
    developing the substrate.

* * * * *

UNITED STATES PATENT AND TRADEMARK OFFICE
CERTIFICATE OF CORRECTION

| | |
|---|---|
| PATENT NO. | : 7,298,457 B2 |
| APPLICATION NO. | : 11/347037 |
| DATED | : November 20, 2007 |
| INVENTOR(S) | : Hiroyuki Maruyama |

It is certified that error appears in the above-identified patent and that said Letters Patent is hereby corrected as shown below:

Title Page, item (56) References Cited, U.S. PATENT DOCUMENTS delete "2002/0008971 A1    1/2002  McKenna ....................362/223"

and insert --2002/0018195 A1   2/2002  Iwamoto......................355/72--

Signed and Sealed this

Sixth Day of May, 2008

JON W. DUDAS
*Director of the United States Patent and Trademark Office*